United States Patent
Konishi et al.

(10) Patent No.: US 11,777,021 B2
(45) Date of Patent: Oct. 3, 2023

(54) SEMICONDUCTOR DEVICE

(71) Applicant: Mitsubishi Electric Corporation, Tokyo (JP)

(72) Inventors: Kazuya Konishi, Tokyo (JP); Koichi Nishi, Tokyo (JP); Tetsuya Nitta, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 235 days.

(21) Appl. No.: 17/409,210

(22) Filed: Aug. 23, 2021

(65) Prior Publication Data
US 2022/0140119 A1    May 5, 2022

(30) Foreign Application Priority Data
Oct. 30, 2020  (JP) .................. 2020-182505

(51) Int. Cl.
*H01L 29/739* (2006.01)
*H01L 29/10* (2006.01)

(52) U.S. Cl.
CPC ...... *H01L 29/7397* (2013.01); *H01L 29/1095* (2013.01)

(58) Field of Classification Search
CPC .............. H01L 29/7397; H01L 29/1095
USPC ..................................... 257/288
See application file for complete search history.

(56) References Cited

U.S. PATENT DOCUMENTS

| | | | |
|---|---|---|---|
| 11,239,350 B2* | 2/2022 | Takahashi | H01L 29/1095 |
| 2017/0213908 A1* | 7/2017 | Fursin | H01L 29/407 |
| 2018/0097094 A1* | 4/2018 | Naito | H01L 29/4236 |
| 2019/0027472 A1* | 1/2019 | Naito | H01L 29/78 |
| 2020/0212190 A1 | 7/2020 | Maekawa | |
| 2021/0134990 A1* | 5/2021 | Nishi | H01L 29/401 |
| 2023/0090883 A1* | 3/2023 | Zhang | H01L 29/0696 257/565 |

FOREIGN PATENT DOCUMENTS

| | | |
|---|---|---|
| JP | 2017-147431 A | 8/2017 |
| JP | 2020-107707 A | 7/2020 |

* cited by examiner

*Primary Examiner* — Igwe U Anya
(74) *Attorney, Agent, or Firm* — Studebaker & Brackett PC

(57) ABSTRACT

A semiconductor device includes: a carrier stored layer; an upper-stage active portion disposed on a first insulating film along an inner wall of an upper portion of a trench penetrating the carrier stored layer, the upper-stage active portion being upper-stage polysilicon connected to a gate electrode; and lower-stage polysilicon disposed on a second insulating film along an inner wall of a lower portion of the trench, the lower-stage polysilicon provided with a third insulating film disposed between the upper-stage active portion and the lower-stage polysilicon. The lower end of the upper-stage active portion is positioned below the lower end of the carrier stored layer.

11 Claims, 20 Drawing Sheets

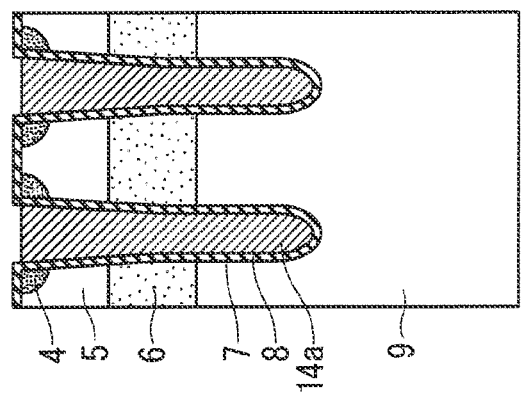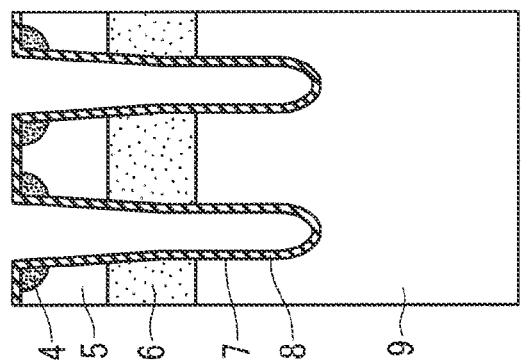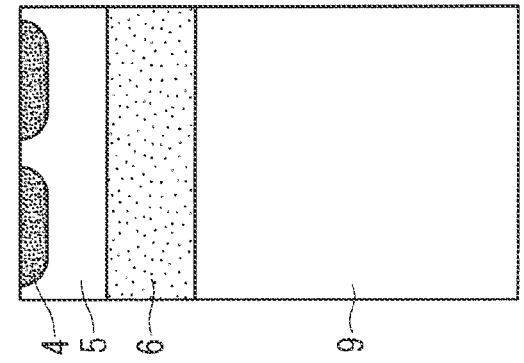

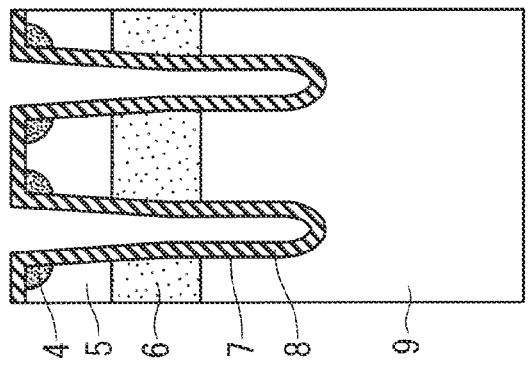
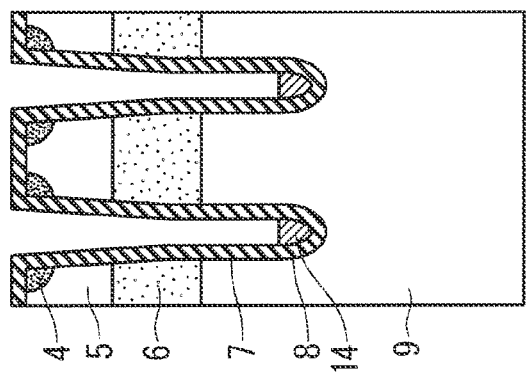
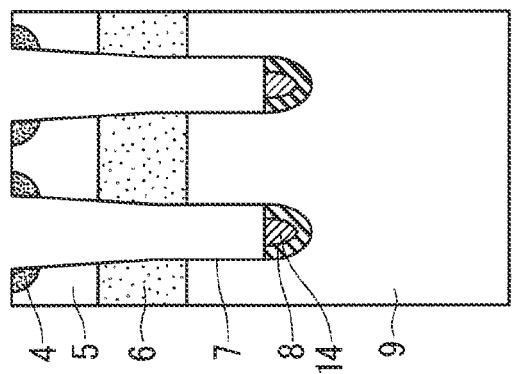

SEMICONDUCTOR DEVICE

BACKGROUND OF THE INVENTION

Field of the Invention

The present disclosure relates to a semiconductor device.

Description of the Background Art

Various techniques have been proposed for semiconductor devices such as insulated gate bipolar transistors (hereinafter, sometimes referred to as "IGBT"). For example, Japanese Patent Application Laid-Open No. 2017-147431 proposes an IGBT in which a two-stage gate including an upper-stage active portion connected to a gate electrode and a lower-stage dummy portion connected to an emitter electrode and insulated from the upper-stage active portion in a trench is used as a gate of the IGBT.

In the IGBT including the two-stage gate, there is an advantage that degradation of gate characteristics does not occur even if hot carriers of dynamic avalanche (DA) generated depending on an electric field near the trench bottom portion are injected into the gate oxide film of the lower-stage dummy portion at the time of turn-off. However, such an IGBT has a problem that the on-state voltage is relatively high.

SUMMARY

The present disclosure has been made in view of the above problems, and an object thereof is to provide a technique capable of reducing an on-state voltage.

A semiconductor device according to the present disclosure includes: a semiconductor substrate provided with an emitter electrode and a gate electrode; a carrier stored layer of a first conductivity type disposed on an upper surface side of the semiconductor substrate; a base layer of a second conductivity type disposed on the upper surface side of the carrier stored layer; a source layer of a first conductivity type disposed on the upper surface side of the base layer; an upper-stage active portion disposed on a first insulating film along an inner wall of an upper portion of a trench penetrating the source layer, the base layer, and the carrier stored layer, the upper-stage active portion being upper-stage polysilicon connected to the gate electrode; and lower-stage polysilicon disposed on a second insulating film along an inner wall of a lower portion of the trench, the lower-stage polysilicon provided with a third insulating film disposed between the upper-stage active portion and the lower-stage polysilicon. The lower-stage polysilicon is any one of a lower-stage dummy portion connected to the emitter electrode, a lower-stage active portion connected to the gate electrode, and a lower-stage floating portion electrically floated. A lower end of the upper-stage active portion is positioned below a lower end of the carrier stored layer.

The on-state voltage can be reduced.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 2A to 2C are cross-sectional views showing a method for manufacturing the semiconductor device according to the first preferred embodiment;

FIGS. 11A to 11C are cross-sectional views showing a method for manufacturing the semiconductor device according to the second preferred embodiment.

DESCRIPTION OF THE PREFERRED EMBODIMENTS

Figure 1:
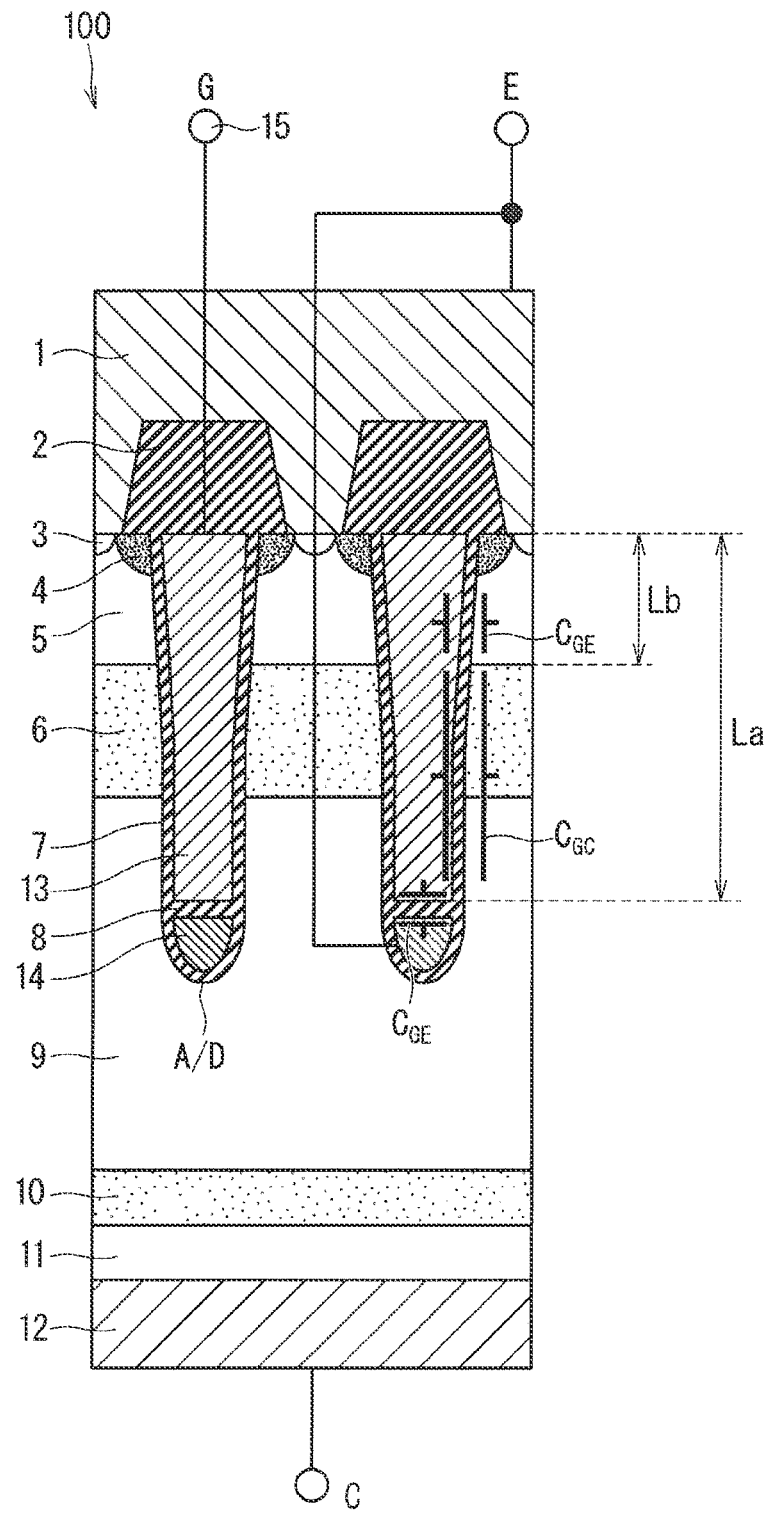
FIG. 1 is a cross-sectional view showing a configuration of a semiconductor device according to a first preferred embodiment.

Hereinafter, preferred embodiments will be described with reference to the accompanying drawings. Features described in the following preferred embodiments are illustrative, and all features are not necessarily essential. In addition, in the following description, similar components in a plurality of preferred embodiments are denoted by the same or similar reference numerals, and different components will be mainly described. In addition, in the following description, a specific position and direction such as "upper", "lower", "left", "right", "front", or "back" do not necessarily need to coincide with a direction at the time of actual implementation.

In addition, the fact that a certain portion has a higher concentration than another portion means that, for example, the average of the concentrations of the certain portion is higher than the average of the concentrations of the other portion. Conversely, the fact that a certain portion has a lower concentration than another portion means that, for example, the average of the concentrations of the certain portion is lower than the average of the concentrations of the other portion. In addition, in the following, the first conductivity type is described as n-type and the second conductivity type is described as p-type, but the first conductivity type may be p-type and the second conductivity type may be n-type. In addition, n⁻ indicates to have lower impurity concentration than n, and n⁺ indicates to have higher impurity concentration than n. Similarly, p⁻ indicates to have lower impurity concentration than p, and p⁺ indicates to have higher impurity concentration than p.

First Preferred Embodiment

Configuration

FIG. 1 is a cross-sectional view showing a configuration of a semiconductor device according to the present first preferred embodiment. Hereinafter, a configuration in which the semiconductor device includes a semiconductor element 100 being an IGBT will be mainly described.

The semiconductor element 100 includes a semiconductor substrate. The semiconductor substrate may be made of a normal semiconductor wafer or an epitaxial growth layer. The semiconductor substrate is provided with an emitter electrode 1 and a gate electrode 15, and in the present first preferred embodiment, the emitter electrode 1 and the gate electrode 15 are disposed on or above the semiconductor substrate.

The semiconductor substrate includes a p⁺-type contact layer 3, an n⁺-type source layer 4, a p-type base layer 5, an n-type carrier stored layer 6, an n⁻-type drift layer 9, an n-type buffer layer 10, and a p-type collector layer 11. That is, the semiconductor substrate is in a range from the n⁺-type source layer 4 and the p⁺-type contact layer 3 to the p-type collector layer 11 in FIG. 1.

In FIG. 1, the upper end of the paper surface of the n⁺-type source layer 4 and the p⁺-type contact layer 3 is the upper surface as the first main surface of the semiconductor substrate, and the lower end of the paper surface of the p-type collector layer 11 is the lower surface as the second main surface of the semiconductor substrate. The upper surface of the semiconductor substrate is a main surface on the front surface side of the semiconductor element 100, and the lower surface of the semiconductor substrate is a main surface on the back surface side of the semiconductor element 100. The semiconductor element 100 includes n⁻-type drift layer 9 between the upper surface, and the lower surface opposite to the upper surface.

As will be described in detail below, a trench 7 is disposed on the upper surface side of the semiconductor substrate, an upper-stage active portion 13 being upper polysilicon is disposed in the upper portion of the trench 7, and a lower-stage dummy portion 14 being lower-stage polysilicon is disposed in the lower portion of the trench 7. In the following description, in the trench 7, a portion on the upper-stage active portion 13 side may be referred to as an active trench.

As shown in FIG. 1, an n-type carrier stored layer 6 having a higher concentration of n-type impurities than the n⁻-type drift layer 9 is disposed on the upper surface side of the semiconductor substrate, specifically, on the upper surface side of the n⁻-type drift layer 9. The n⁻-type drift layer 9 is a semiconductor layer containing, for example, arsenic or phosphorus as n-type impurities, and the concentration of the n-type impurities in the n⁻-type drift layer 9 is, for example, 1.0E+12/cm³ to 1.0E+15/cm³. The n-type carrier stored layer 6 is a semiconductor layer containing, for example, arsenic or phosphorus as n-type impurities, and the concentration of the n-type impurities of the n-type carrier stored layer 6 is, for example, 1.0E+13/cm³ to 1.0E+17/cm³. The concentration of the n-type impurities in the n-type carrier stored layer 6 is preferably higher than the concentration of the n-type impurities in the n⁻-type drift layer 9 by, for example, about 1 to 2 digits. Disposing the n-type carrier stored layer 6 allows conduction loss when a current flows to be reduced. The n-type carrier stored layer 6 and the n⁻-type drift layer 9 may be collectively referred to as a drift layer.

The n-type carrier stored layer 6 is formed, for example, by ion-implanting n-type impurities into a semiconductor substrate constituting the n⁻-type drift layer 9, and then diffusing the implanted n-type impurities into the semiconductor substrate being the n⁻-type drift layer 9 by annealing.

The p-type base layer 5 is disposed on the upper surface side of the n-type carrier stored layer 6. The p-type base layer 5 is in contact with the gate oxide film 8 of the active trench.

On the upper surface side of the p-type base layer 5, the n⁺-type source layer 4 is disposed in contact with the gate oxide film 8 of the active trench, and the p⁺-type contact layer 3 is disposed in the remaining region. The n⁺-type source layer 4 and the p⁺-type contact layer 3 constitute an upper surface of the semiconductor substrate. In the present first preferred embodiment, the n⁺-type source layer 4 is disposed in contact with the gate oxide film 8 on both sides in the width direction of the trench 7. The p⁺-type contact layer 3 is disposed between the adjacent trenches 7. The n⁺-type source layer 4 and the p⁺-type contact layer 3 may be alternately arranged along the extending direction (direction to pass FIG. 1) of the trench 7.

It should be noted that the p⁺-type contact layer 3 is a region having a higher p-type impurity concentration than the p-type base layer 5. When the p⁺-type contact layer 3 and the p-type base layer 5 need to be distinguished from each other, they may be referred to individually, or the p⁺-type contact layer 3 and the p-type base layer 5 may be collectively referred to as a p-type base layer.

In addition, in the semiconductor element 100, an n-type buffer layer 10 having a higher concentration of n-type impurities than the n⁻-type drift layer 9 is disposed on the lower surface side of the n⁻-type drift layer 9. The n-type buffer layer 10 is disposed to suppress punch-through of a depletion layer extending from the p-type base layer 5 to the lower surface side when the semiconductor element 100 is in the off state. The n-type buffer layer 10 may be formed by implantation of phosphorus (P) or protons (H⁺), or may be formed by implantation of both phosphorus (P) and protons (H⁺), for example. It should be noted that the semiconductor element 100 may have a configuration in which the n⁻-type drift layer 9 is also disposed in the region of the n-type buffer layer 10 shown in FIG. 1, without the n-type buffer layer 10 being disposed. The n-type buffer layer 10 and the n⁻-type drift layer 9 may be collectively referred to as a drift layer.

In the semiconductor element 100, a p-type collector layer 11 is disposed on the lower surface side of the n-type buffer layer 10. That is, the p-type collector layer 11 is disposed between the n⁻-type drift layer 9 and the lower surface of the semiconductor substrate.

As shown in FIG. 1, in the semiconductor element 100, a trench 7 is disposed that penetrates the p-type base layer 5 from the upper surface of the semiconductor substrate and reaches the n⁻-type drift layer 9. Specifically, the trench 7 penetrates the n$^+$-type source layer 4, the p-type base layer 5, and the n-type carrier stored layer 6.

The upper-stage active portion 13 being the upper-stage polysilicon is disposed on the first insulating film along the inner wall of the upper portion of the trench 7. The lower-stage dummy portion 14 being the lower-stage polysilicon is disposed on the second insulating film along the inner wall of the lower portion of the trench 7, and the third insulating film is disposed between the lower-stage dummy portion 14 and the upper-stage active portion 13. That is, the upper-stage active portion 13 and the lower-stage dummy portion 14 are electrically insulated by the third insulating film.

The upper-stage active portion 13 is connected to the gate electrode 15, and each of the first insulating film and the third insulating film is included in the gate oxide film 8.

The lower-stage dummy portion 14 is connected to the emitter electrode 1. When the lower-stage polysilicon is the lower-stage dummy portion 14 as in the present first preferred embodiment, the second insulating film between the inner wall of the lower portion of the trench 7 and the lower-stage dummy portion 14 does not have the function of a general gate oxide film. However, in the modification described below, in view of the fact that the lower-stage polysilicon may be the lower-stage active portion rather than the lower-stage dummy portion 14, hereinafter, for convenience, description will be made assuming that the second insulating film is also included in the gate oxide film 8.

As described above, the semiconductor device according to the present first preferred embodiment includes a two-stage gate A/D made of the upper-stage active portion 13 and the lower-stage dummy portion 14 that are electrically separated. Then, the lower end of the upper-stage active portion 13 is positioned below the lower end of the n-type carrier stored layer 6. It should be noted that in the present first preferred embodiment, the depth La of the upper-stage active portion 13 is 1.5 times or more the depth Lb of the p-type base layer 5, but the present invention is not limited thereto. It should be noted that the depth of the component corresponds to the size from the upper surface of the semiconductor substrate to the lower end of the component.

The upper portion of the upper-stage active portion 13 faces the p-type base layer 5 via the first insulating film of the gate oxide film 8. When a gate drive voltage is applied to the upper-stage active portion 13, a channel is formed in the p-type base layer 5 in contact with the gate oxide film 8 of the active trench.

As shown in FIG. 1, an interlayer insulating film 2 is disposed on the upper-stage active portion 13. The emitter electrode 1 is disposed on a region where the interlayer insulating film 2 is not disposed on the upper surface of the semiconductor substrate, and on the interlayer insulating film 2.

As shown in FIG. 1, the emitter electrode 1 is in ohmic contact with the n$^+$-type source layer 4, the p$^+$-type contact layer 3, and the lower-stage dummy portion 14, and is electrically connected to the n$^+$-type source layer 4, the p$^+$-type contact layer 3, and the lower-stage dummy portion 14. It should be noted that in another cross section, the emitter electrode 1 is electrically connected to the lower-stage dummy portion 14.

The emitter electrode 1 may be made of, for example, an aluminum alloy such as an aluminum silicon alloy (Al—Si-based alloy), or may be made of multi-layer metal films in which a plating film is formed on an electrode made of an aluminum alloy by electroless plating or electrolytic plating. The plating film formed by electroless plating or electrolytic plating may be, for example, a nickel (Ni) plating film. In addition, when there is a region which is minute between adjacent interlayer insulating films 2 or the like and in which favorable embedding cannot be obtained in the emitter electrode 1, a tungsten film having better embeddability than the emitter electrode 1 may be arranged in the minute region, and the emitter electrode 1 may be provided on the tungsten film.

It should be noted that a barrier metal may be provided between the interlayer insulating film 2 and the emitter electrode 1. The barrier metal may be, for example, a conductor containing titanium (Ti) such as titanium nitride, or TiSi obtained by alloying titanium and silicon (Si). In addition, the barrier metal may be provided only on an n-type semiconductor layer such as the n$^+$-type source layer 4. The barrier metal and the emitter electrode 1 may be collectively referred to as an emitter electrode.

A collector electrode 12 is provided on the lower surface side of the p-type collector layer 11. Similarly to the emitter electrode 1, the collector electrode 12 may be made of an aluminum alloy, may be made of an aluminum alloy and a plating film, or may be made differently from the emitter electrode 1. The collector electrode 12 is in ohmic contact with the p-type collector layer 11 and is electrically connected to the p-type collector layer 11.

Manufacturing Method

Next, an example of a method for manufacturing the semiconductor element according to the present first preferred embodiment will be described. First, a semiconductor substrate including the n$^-$-type drift layer 9 is prepared. For the semiconductor substrate, for example, an n-type wafer containing n-type impurities such as an FZ wafer manufactured by a floating zone (FZ) method or an MCZ wafer manufactured by a magnetic applied CZochralki (MCZ) method may be used.

The concentration of the n-type impurities contained in the semiconductor substrate is appropriately selected depending on the withstand voltage of the semiconductor device to be manufactured. For example, in a semiconductor device having a withstand voltage of 1200 V, the concentration of n-type impurities is adjusted so that the specific resistance of the n$^-$-type drift layer 9 constituting the semiconductor substrate is about 40 to 120 Ω·cm. In a step of preparing the semiconductor substrate, the entire semiconductor substrate is the n$^-$-type drift layer 9. Implanting p-type or n-type impurity ions described below from the upper surface side or the lower surface side of such a semiconductor substrate and then diffusing them into the semiconductor substrate by heat treatment or the like forms a p-type or n-type semiconductor layer in the semiconductor substrate and manufactures the semiconductor element 100.

It should be noted that a region serving as a termination region is disposed around the cell region where the semiconductor element 100 is disposed. Hereinafter, a method for manufacturing the configuration of the cell region of the semiconductor element 100 will be mainly described, but the termination region of the semiconductor element 100 may be manufactured by a well-known manufacturing method. For example, a field limiting ring (FLR) including a p-type termination well layer as a withstand voltage holding structure may be formed in the termination region. In this case, the FLR may be formed by implanting p-type impurity ions into the termination region before treating the cell region of the semiconductor element 100, or the FLR may be formed by implanting p-type impurity ions into the termination region simultaneously with the implantation of p-type impurity ions into the cell region of the semiconductor element 100.

Next, n-type impurities such as phosphorus (P) are implanted from the upper surface side of the semiconductor substrate, and the n-type carrier stored layer 6 is formed. In addition, p-type impurities such as boron (b) are implanted from the upper surface side of the semiconductor substrate, and the p-type base layer 5 is formed. The n-type carrier stored layer 6 and the p-type base layer 5 are formed by implanting impurity ions into the semiconductor substrate and then diffusing the impurity ions by heat treatment. Since the n-type impurities and the p-type impurities are ion-implanted after the mask processing is performed on the upper surface of the semiconductor substrate, the n-type carrier stored layer 6 and the p-type base layer 5 are selectively formed on the upper surface side of the semiconductor substrate. Specifically, the n-type carrier stored layer 6 and the p-type base layer 5 are formed in the cell region, and are connected to the p-type termination well layer in the termination region. It should be noted that the mask processing is processing of applying a resist on a semiconductor substrate and forming an opening in a predetermined region of the resist using a photoengraving technique to form on the semiconductor substrate a mask for performing ion-implantation or etching on a predetermined region of the semiconductor substrate through the opening.

Next, as shown in FIG. 2A, n-type impurities are selectively implanted into the upper surface side of the p-type base layer 5 in the cell region by mask processing, and the $n^+$-type source layer 4 is formed. The n-type impurities to be implanted may be, for example, arsenic (As) or phosphorus (P).

Then, as shown in FIG. 2B, a trench 7 is formed that penetrates the $n^+$-type source layer 4, the p-type base layer 5, and the n-type carrier stored layer 6 from the upper surface side of the semiconductor substrate and reaches the $n^-$-type drift layer 9. In the cell region, the sidewall of the trench 7 penetrating the $n^+$-type source layer 4 constitutes a part of the $n^+$-type source layer 4. The trench 7 may be formed by depositing an oxide film such as $SiO_2$ serving as a mask on a semiconductor substrate, and then forming an opening in a portion where the trench 7 is to be formed in the oxide film by mask processing, and etching the semiconductor substrate with the oxide film forming the opening as a mask.

Thereafter, the semiconductor substrate is heated in an atmosphere containing oxygen, and the gate oxide film 8 is formed on the inner wall of the trench 7 and the upper surface of the semiconductor substrate. The gate oxide film 8 formed on the upper surface of the semiconductor substrate is removed in a later step.

Next, as shown in FIG. 2C, polysilicon 14a doped with n-type or p-type impurities is deposited by chemical vapor deposition (CVD) or the like in the trench 7 in which the gate oxide film 8 is formed.

Figure 3A:
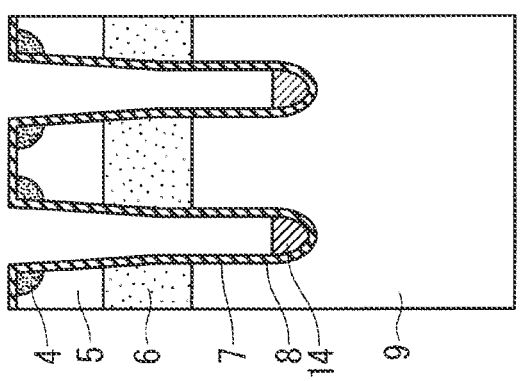
FIGS. 3A to 3C are cross-sectional views showing a method for manufacturing the semiconductor device according to the first preferred embodiment.

Next, as shown in FIG. 3A, the upper portion of the polysilicon 14a is etched, and the lower-stage dummy portion 14 is formed. At this time, the gate oxide film 8 formed on the upper surface of the semiconductor substrate serves as a mask, and etching on the upper surface of the semiconductor substrate and the $n^+$-type source layer 4 is suppressed.

Figure 3B:
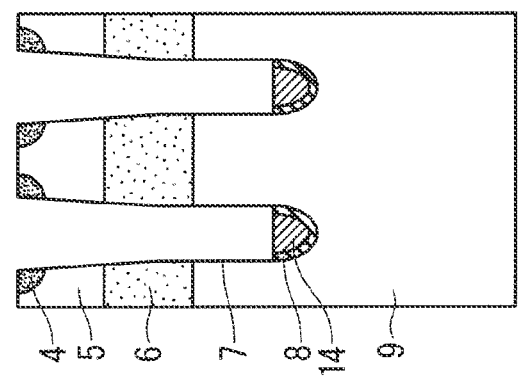

Then, as shown in FIG. 3B, the exposed gate oxide film 8 is removed by wet etching or the like. That is, the gate oxide film 8 on the inner wall of the upper portion of the trench 7, the lower-stage dummy portion 14, and the upper surface of the semiconductor substrate is removed.

Figure 3C:
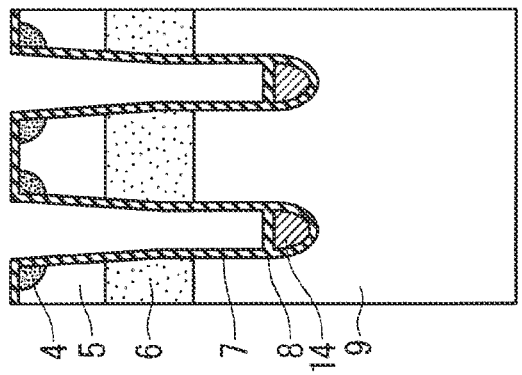

Next, as shown in FIG. 3C, the semiconductor substrate is heated in an atmosphere containing oxygen, and the gate oxide film 8 is formed on the upper portion of the lower-stage dummy portion 14, the exposed inner wall of the trench 7, and the like.

Figure 4B:
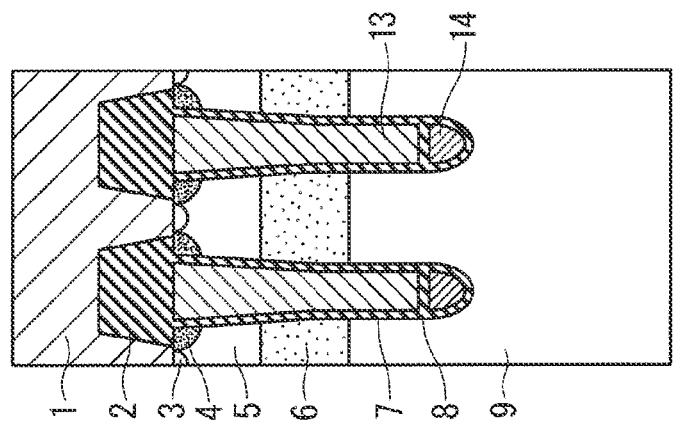
FIGS. 4A and 4B are cross-sectional views showing a method for manufacturing the semiconductor device according to the first preferred embodiment.
Figure 4A:
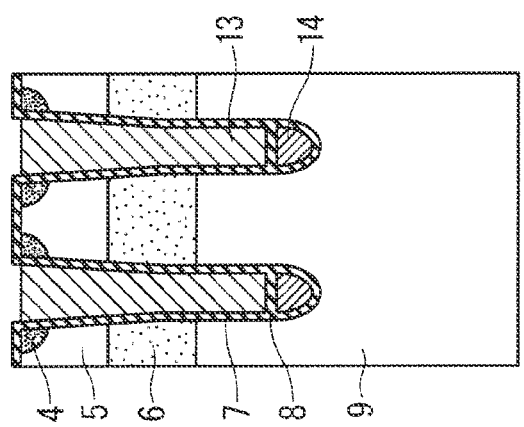

Then, as shown in FIG. 4A, polysilicon doped with n-type or p-type impurities is deposited by CVD or the like in the trench 7 in which the gate oxide film 8 is formed, and the upper-stage active portion 13 is formed.

Next, the $p^+$-type contact layer 3 is formed. Then, after the interlayer insulating film 2 is formed on the upper-stage active portion 13, that is, on the two-stage gate A/D, the gate oxide film 8 formed on the upper surface of the semiconductor substrate is removed. The interlayer insulating film 2 may be, for example, $SiO_2$. Then, a contact hole is formed in the deposited interlayer insulating film 2 by mask processing. The contact hole is formed on the $n^+$-type source layer 4 and the $p^+$-type contact layer 3.

Then, as shown in FIG. 4B, the emitter electrode 1 is formed on the upper surface of the semiconductor substrate and the interlayer insulating film 2. The emitter electrode 1 may be formed by depositing an aluminum silicon alloy (Al—Si-based alloy) by physical vapor deposition (PVD) such as sputtering or vapor deposition. In addition, the emitter electrode 1 may be formed by further forming a nickel alloy (Ni alloy) on the formed aluminum silicon alloy by electroless plating or electrolytic plating. Since forming the emitter electrode 1 by plating allows a thick metal film to be easily formed as the emitter electrode 1, heat resistance can be improved by an increase in heat capacity of the emitter electrode 1. It should be noted that when a nickel alloy is further formed by plating treatment after the emitter electrode 1 made of an aluminum silicon alloy is formed by PVD, the plating treatment for forming the nickel alloy may be performed after treatment of the lower surface side of the semiconductor substrate is performed.

Next, the lower surface side of the semiconductor substrate is ground, and the semiconductor substrate is thinned to a designed predetermined thickness. The thickness of the ground semiconductor substrate may be, for example, 80 µm to 200 µm.

Then, n-type impurities are implanted from the lower surface side of the semiconductor substrate, and the n-type buffer layer 10 is formed. Furthermore, p-type impurities are implanted from the lower surface side of the semiconductor substrate, and the p-type collector layer 11 is formed.

The n-type buffer layer 10 may be formed by, for example, implanting phosphorus (P) ions, implanting protons (W), or implanting both protons and phosphorus. Protons can be implanted from the lower surface of the semiconductor substrate to a deep position with relatively low acceleration energy. In addition, changing the acceleration energy allows the depth of proton implantation to be relatively easily changed. Therefore, when the n-type buffer layer 10 is formed of protons, performing implantation a plurality of times while changing the acceleration energy makes it possible to form the n-type buffer layer 10 thicker in the thickness direction of the semiconductor substrate than that formed of phosphorus.

In addition, phosphorus can have a higher activation rate as an n-type impurity than a proton. Therefore, even in a thinned semiconductor substrate, forming the n-type buffer layer 10 with phosphorus allows punch-through of the depletion layer to be suppressed. In order to further thin the semiconductor substrate, it is preferable to form the n-type buffer layer 10 by implanting both protons and phosphorus so that protons are implanted at a position deeper than phosphorus from the lower surface.

The p-type collector layer 11 may be formed by implanting boron (b), for example. After boron is ion-implanted from the lower surface side of the semiconductor substrate, the lower surface is irradiated with a laser beam to be laser-annealed, whereby the implanted boron is activated to form the p-type collector layer 11. At this time, phosphorus in the n-type buffer layer 10 implanted at a relatively shallow position from the lower surface of the semiconductor substrate is also activated at the same time.

It should be noted that since protons of the n-type buffer layer 10 are activated at a relatively low annealing temperature such as 380° C. to 420° C., it is necessary to take note so that the entire semiconductor substrate does not reach a temperature higher than 380° C. to 420° C. except for a step for activating protons after proton implantation. Since the laser annealing described above can heat only the vicinity of the lower surface of the semiconductor substrate to a high temperature, the laser annealing can be used for activating n-type impurities and p-type impurities after proton implantation.

Next, the collector electrode 12 is formed on the lower surface of the semiconductor substrate. The collector electrode 12 may be formed by depositing an aluminum silicon alloy (Ai—Si-based alloy), titanium (Ti), or the like by PVD such as sputtering or vapor deposition, or may be formed by laminating a plurality of metals such as an aluminum silicon alloy, titanium, nickel, or gold. In addition, the collector electrode 12 may be formed by further forming a metal film of electroless plating or electrolytic plating on the metal film formed by PVD.

Through the above steps, a plurality of semiconductor elements 100 are manufactured in a matrix on one n-type wafer. The semiconductor element 100 is individually cut and completed by laser dicing or blade dicing.

Turn-On Loss and On-State Voltage

Next, before the turn-on loss and the on-state voltage of the semiconductor element 100 according to the present first preferred embodiment are described, contents related thereto will be described.

Figure 5:
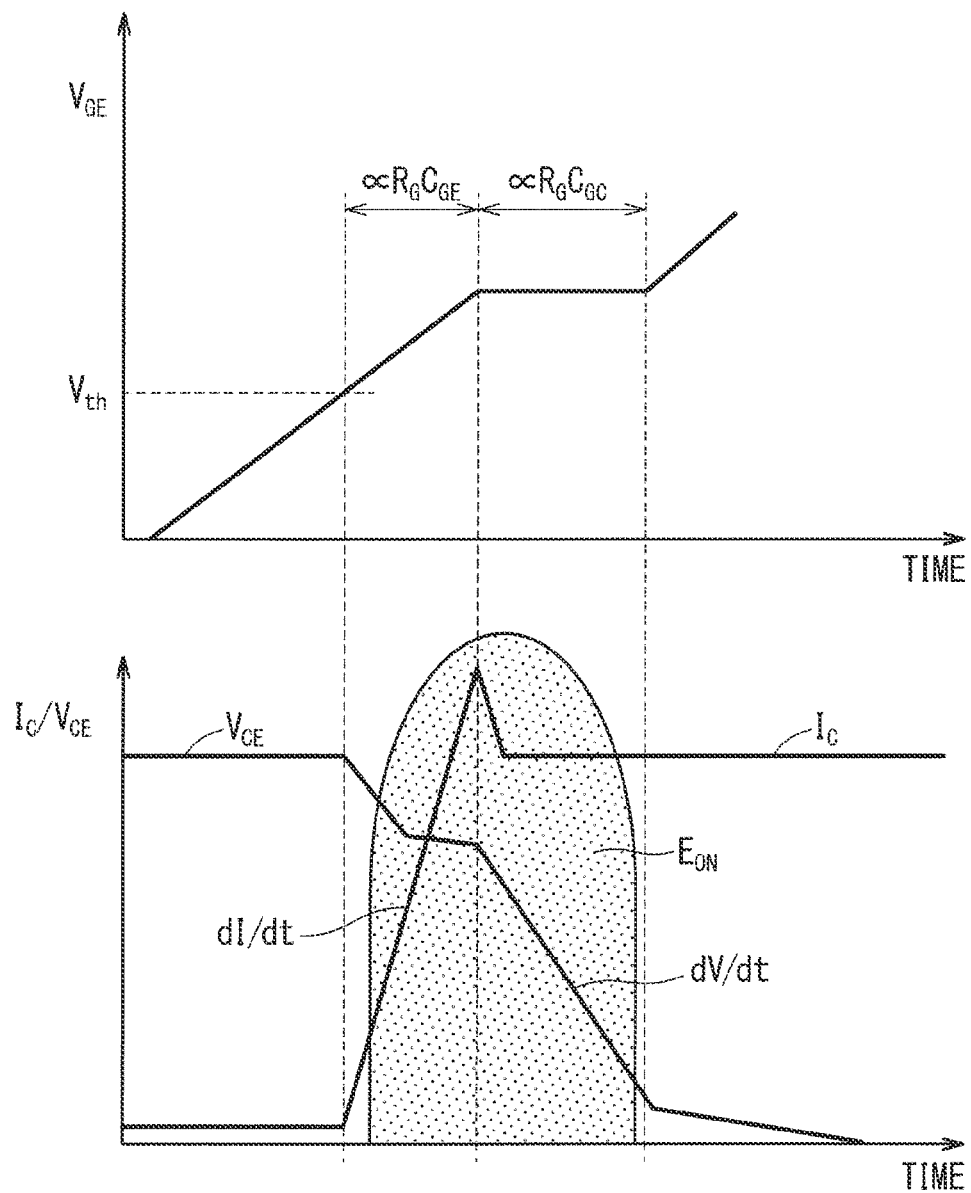
FIG. 5 is a diagram for illustrating a turn-on loss.

FIG. 5 is a diagram for illustrating a turn-on loss ($E_{ON}$). The dI/dt is determined by a gate resistance (hereinafter sometimes referred to as "$R_G$") and a gate-emitter capacitance (hereinafter sometimes referred to as "$C_{GE}$"). The first period from when the current $I_C$ increases until the voltage $V_{GE}$ temporarily becomes constant becomes shorter as the dI/dt increases, and is substantially proportional to the $R_G$ and the $C_{GE}$.

The dV/dt is determined by a gate resistance ($R_G$) and a gate-collector capacitance (hereinafter, also referred to as "$C_{GC}$"). The second period in which the voltage $V_{GE}$ is temporarily kept constant becomes shorter as the absolute value of dV/dt increases, and is substantially proportional to $R_G$ and $C_{GC}$.

As the switching time corresponding to the sum of the first period and the second period decreases, the turn-on loss ($E_{ON}$) decreases. Therefore, as the gate capacitance ($C_{GE}$, $C_{GC}$) is reduced, dI/dt and the absolute value of dV/dt increase, and the turn-on loss ($E_{ON}$) can be reduced.

However, when both dI/dt and the absolute value of dV/dt are too large, problems such as occurrence of radiation noise occur, so that dI/dt or dV/dt is adjusted by $R_G$ so as to be a predetermined value. Which one of dI/dt and dV/dt is set to a predetermined value differs depending on the intended use, but in the present first preferred embodiment, description will be made assuming that dV/dt is set to a predetermined value.

Figure 6:
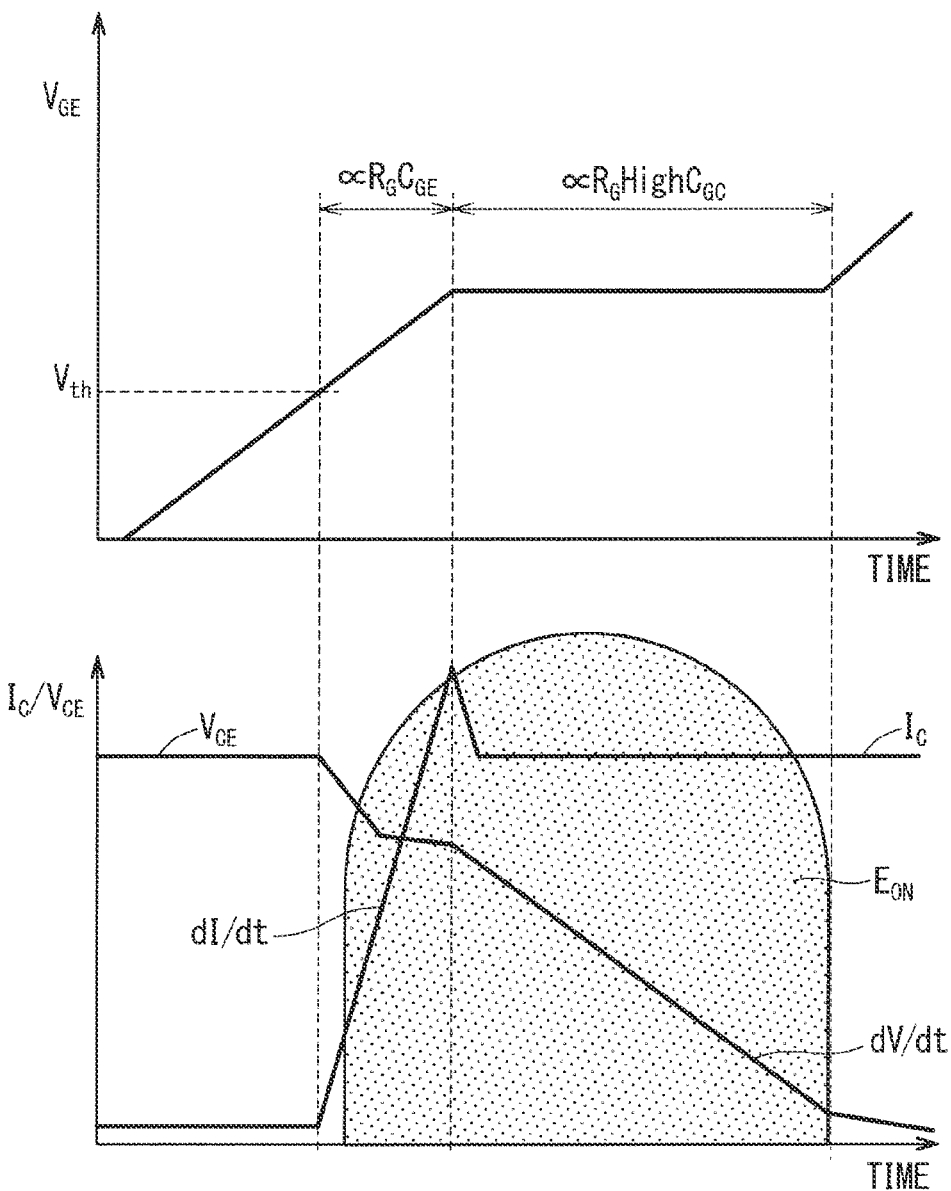
FIG. 6 is a diagram for illustrating a turn-on loss.

FIG. 6 is a diagram for illustrating a turn-on loss ($E_{ON}$) when the $C_{GG}$ is increased from the state in FIG. 5. As the $C_{GG}$ is increased, the absolute value of dV/dt decreases, and the second period becomes longer.

Figure 7:
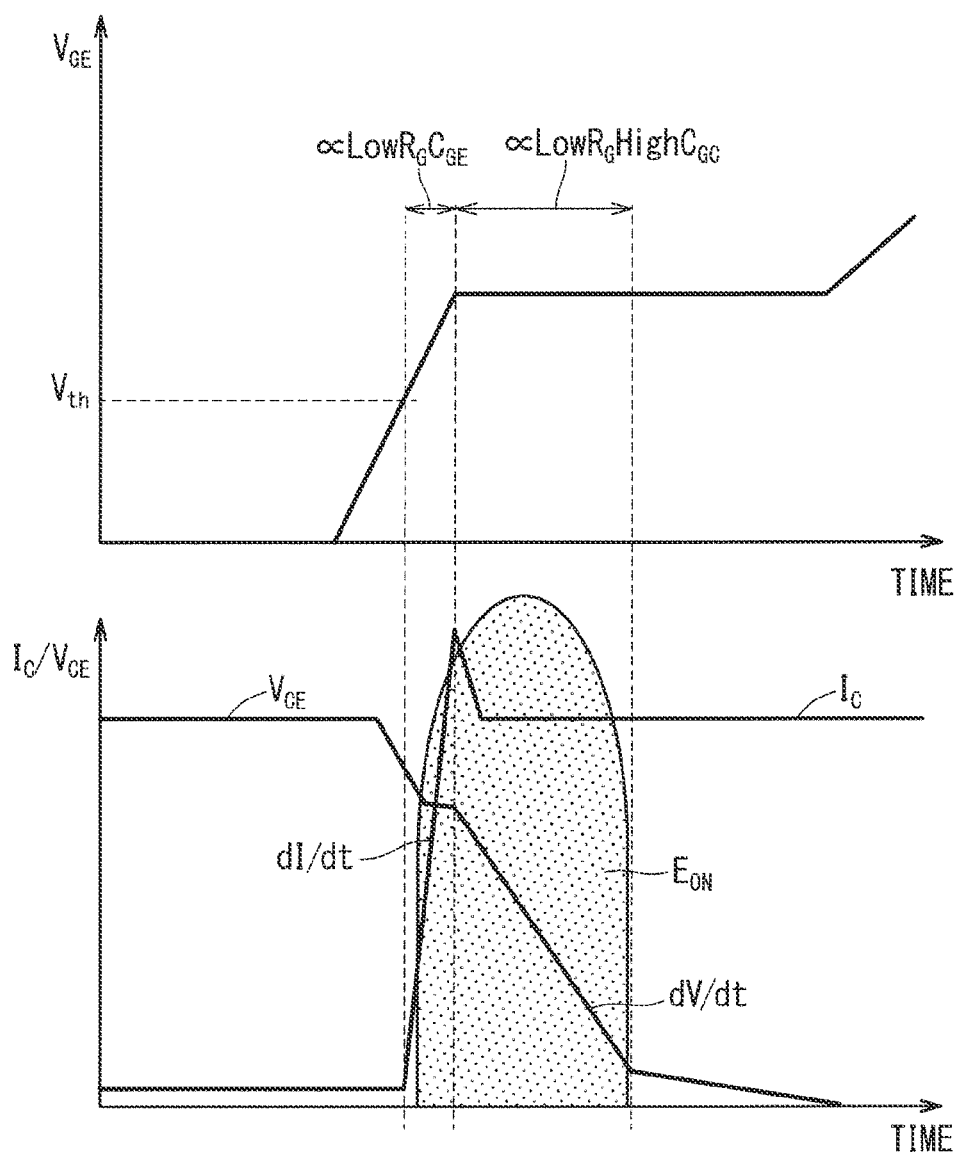
FIG. 7 is a diagram for illustrating a turn-on loss.

FIG. 7 is a diagram illustrating a turn-on loss ($E_{ON}$) when the $C_{GG}$ is increased from the state in FIG. 5, and the $R_G$ is decreased so that dV/dt becomes a predetermined value. Decreasing the $R_G$ causes dV/dt to become a predetermined value, and the second period becomes substantially the same as the second period in FIG. 5. On the other hand, decreasing the $R_G$ causes dI/dt to increase, and the first period proportional to the $R_G$ and the $C_{GE}$ is shorter than the first period in FIG. 5. Thus, in a state where dV/dt is a predetermined value, the switching time in FIG. 7 is shorter than the switching time in FIG. 5, and the turn-on loss ($E_{ON}$) in FIG. 7 is reduced than the turn-on loss ($E_{ON}$) in FIG. 5.

As described above, in order to reduce the turn-on loss, it is effective to increase the ratio of $C_{GC}/C_{GE}$ by increasing the $C_{GC}$.

Figure 8:
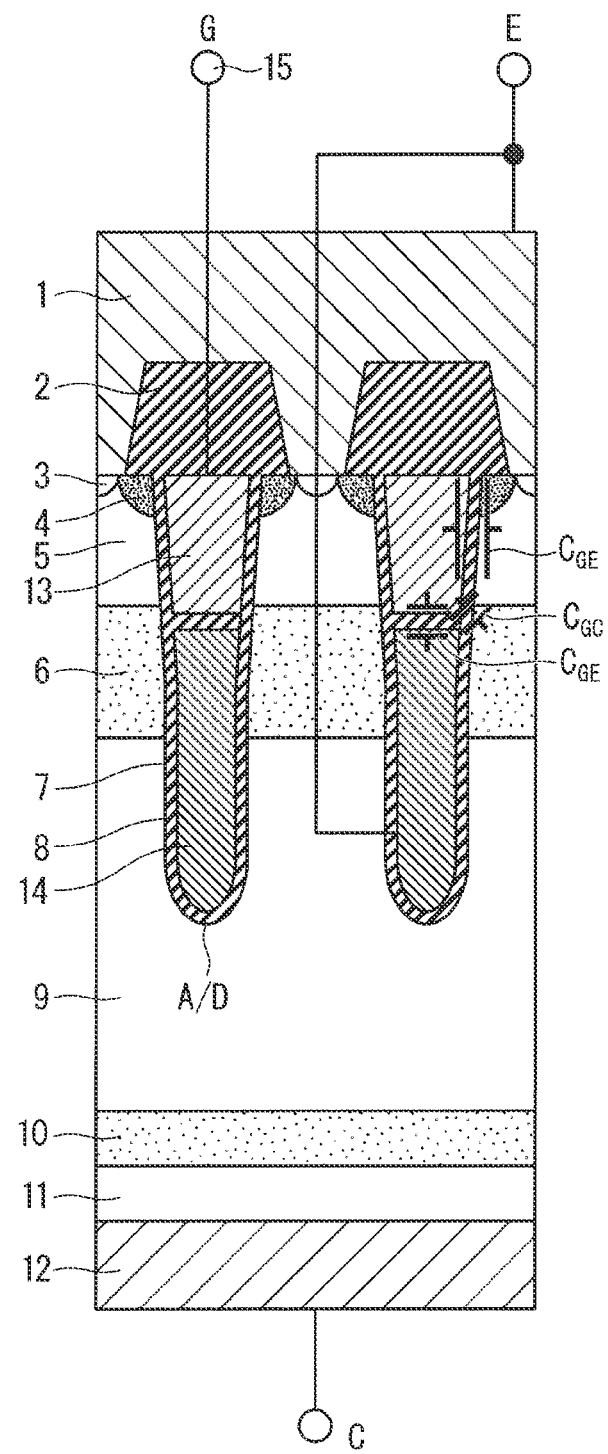
FIG. 8 is a cross-sectional view showing a method for manufacturing a first related semiconductor device.

FIG. 8 is a cross-sectional view showing a configuration of a first related semiconductor device related to the semiconductor device according to the present first preferred embodiment. The first related semiconductor device has the IGBT structure including the two-stage gate A/D as in the first preferred embodiment, but the depth of the upper-stage active portion 13 is about the same as the depth of the p-type base layer 5.

Here, in a general one-stage gate, $C_{GE}$ occurs in a portion between the upper-stage active portion 13 and the p-type base layer 5, and $C_{GC}$ occurs in a portion between the upper-stage active portion 13 and the n⁻-type drift layer 9 and between the upper-stage active portion 13 and the n-type carrier stored layer 6.

In the IGBT structure in FIG. 8, since the upper-stage active portion 13 hardly faces the n⁻-type drift layer 9 and the n-type carrier stored layer 6, the $C_{GC}$ of the IGBT structure in FIG. 8 is smaller than the $C_{GC}$ of a general one-stage gate IGBT structure. Moreover, in the IGBT structure in FIG. 8, since the $C_{GE}$ also occurs between the upper-stage active portion 13 and the lower-stage dummy portion 14, the $C_{GE}$ of the IGBT structure of the two-stage gate A/D in FIG. 8 is larger than the $C_{GE}$ of the IGBT structure of a general one-stage gate. As a result, in the IGBT structure in FIG. 8, since the $C_{GC}$ is small and the $C_{GC}/C_{GE}$ is small, there is a problem that the turn-on loss cannot be reduced when dV/dt is set to a predetermined value.

In the first related semiconductor as described above, it is not considered to reduce the turn-on loss by increasing the $C_{GC}/C_{GE}$, and conversely, for example, the feedback capacitance is reduced by decreasing the $C_{GC}/C_{GE}$. That is, in the first related semiconductor, the depth of the upper-stage active portion 13 is about the same as the depth of the p-type base layer 5 so as not to increase the $C_{GC}$ as much as possible.

However, when the depth of the upper-stage active portion 13 is smaller than the depth of the p-type base layer 5, the channel cannot be turned on. Therefore, the depth of the upper-stage active portion 13 is slightly larger than the depth of the p-type base layer 5 so that the channel is turned on even if there is a manufacturing variation in the depth of the upper-stage active portion 13. Specifically, in the first related semiconductor, the depth of the upper-stage active portion 13 is designed to be about 1.1 times the depth of the p-type base layer 5.

Figure 9:
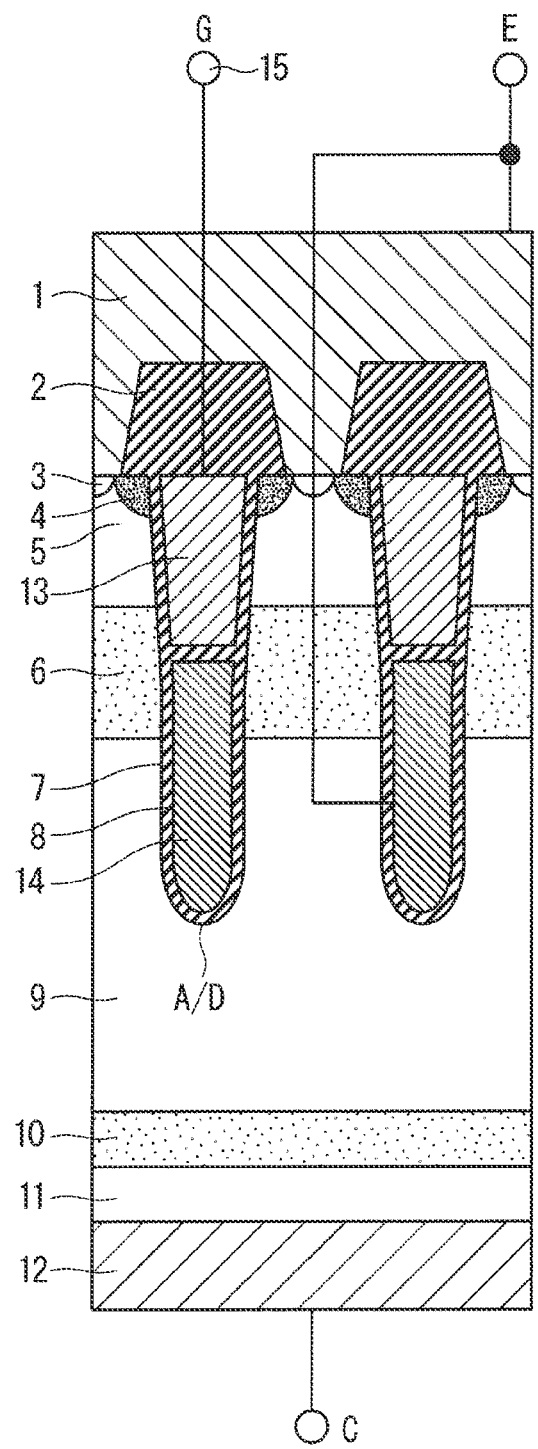
FIG. 9 is a cross-sectional view showing a method for manufacturing a second related semiconductor device.

FIG. 9 is a cross-sectional view showing a configuration of a second related semiconductor device related to the semiconductor device according to the present first preferred embodiment. The second related semiconductor device in FIG. 9 is a diagram assuming that there is a variation of about 0 to 30% in a process such as a diffusion step in the first related semiconductor device in FIG. 8, and the depth of the upper-stage active portion 13 is about 1.4 times the depth of the p-type base layer 5.

In the IGBT structure in FIG. 9, since a portion where the upper-stage active portion 13 faces the n-type carrier stored layer 6 is larger than that in the IGBT structure in FIG. 8, the $C_{GC}/C_{GE}$ is larger. However, in the IGBT structure in FIG. 9, since the lower end of the upper-stage active portion 13 is positioned above the lower end of the n-type carrier stored layer 6, the upper-stage active portion 13 does not face the lower portion of the n-type carrier stored layer 6. Therefore, there is room for increasing the $C_{GC}/C_{GE}$. In addition, since the stored layer cannot be formed at the portion in contact with the side surface of the trench 7 in the lower portion of the n-type carrier stored layer 6, the carrier stored effect when the gate voltage is applied is low, and the on-state voltage is high.

Gist of First Preferred Embodiment

In the present first preferred embodiment, the lower end of the upper-stage active portion 13 is configured to be positioned below the lower end of the n-type carrier stored layer 6. According to this configuration, since facing the lower portion of the n-type carrier stored layer 6 by the upper-stage active portion 13 allows the $C_{GC}/C_{GE}$ to be increased, the turn-on loss can be reduced. In addition, since the stored layer is formed in the portion in contact with the side surface of the trench 7 in the lower portion of the n-type carrier stored layer 6, the carrier stored effect can be enhanced, and the on-state voltage can be reduced.

In addition, in the present first preferred embodiment, as shown in FIG. 1, the depth La of the upper-stage active portion 13 is 1.5 times or more the depth Lb of the p-type base layer 5. According to this configuration, since increasing the facing portion between the upper-stage active portion 13 and the n$^-$-type drift layer 9 allows the $C_{GC}/C_{GE}$ to be increased, the turn-on loss can be reduced.

First Modification

In the present first preferred embodiment, the depth La of the upper-stage active portion 13 in the two-stage gate A/D is 1.5 times or more the depth Lb of the p-type base layer 5, but the present invention is not limited thereto. For example, the depth La of the upper-stage active portion 13 may be twice or more the depth Lb of the p-type base layer 5.

According to this configuration, since further increasing the facing portion between the upper-stage active portion 13 and the n$^-$-type drift layer 9 allows the $C_{GC}/C_{GE}$ to be further increased, the turn-on loss can be further reduced. In addition, as a specific effect of the present first modification, even when the depth Lb of the p-type base layer 5 becomes larger than expected due to process variation such as thermal diffusion, a large $C_{GC}/C_{GE}$ can be maintained.

Second Preferred Embodiment

Configuration

Figure 10:
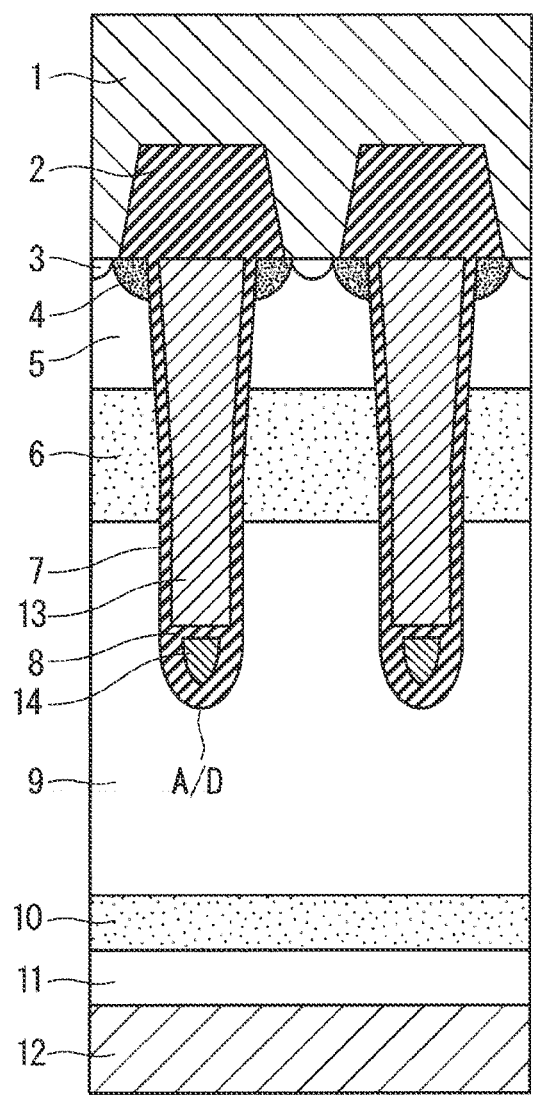
FIG. 10 is a cross-sectional view showing a configuration of a semiconductor device according to a second preferred embodiment.

FIG. 10 is a cross-sectional view showing a configuration of a semiconductor device according to the present second preferred embodiment. It should be noted that in the cross-sectional views in FIG. 10 and subsequent figures, illustration of the gate electrode 15, its wiring line, and the like may be appropriately omitted.

In the first preferred embodiment, the thickness of the gate oxide film 8 is not particularly designated. On the other hand, in the present second preferred embodiment, in the gate oxide film 8, the thickness of the second insulating film between the lower-stage dummy portion 14 and the inner wall of the trench 7 is larger than the thickness of the first insulating film between the upper-stage active portion 13 and the inner wall of the trench 7.

Manufacturing Method

First, the step in FIG. 2A described in the first preferred embodiment is performed. Next, as shown in FIG. 11A, after the trench 7 is formed, the semiconductor substrate is heated in an atmosphere containing oxygen, and a relatively thick gate oxide film 8 is formed on the inner wall of the trench 7 and the upper surface of the semiconductor substrate.

Then, polysilicon doped with n-type or p-type impurities is deposited by CVD or the like in the trench 7 in which the gate oxide film 8 is formed.

Next, as shown in FIG. 11B, the upper portion of the polysilicon is etched, and the lower-stage dummy portion 14 is formed. At this time, the thick gate oxide film 8 formed on the upper surface of the semiconductor substrate serves as a mask, and etching on the upper surface of the semiconductor substrate and the n$^+$-type source layer 4 is suppressed.

Then, as shown in FIG. 11C, the exposed gate oxide film 8 is removed by wet etching or the like. That is, the gate oxide film 8 formed on the inner wall of the upper portion of the trench 7, the lower-stage dummy portion 14, and the upper surface of the semiconductor substrate is removed.

Next, the semiconductor substrate is heated in an atmosphere containing oxygen, and a relatively thin gate oxide film 8 is formed on the upper portion of the lower-stage dummy portion 14, the exposed inner wall of the trench 7, and the like. It should be noted that the thin gate oxide film 8 formed on the upper surface of the semiconductor substrate is removed in a later step as in the first preferred embodiment. Thereafter, polysilicon doped with n-type or p-type impurities is deposited by CVD or the like in the trench 7 in which the gate oxide film 8 is formed, and the upper-stage active portion 13 is formed.

Gist of Second Preferred Embodiment

In the configuration in which the upper-stage active portion 13 is disposed deep as in the first preferred embodiment, it is necessary to perform etching of polysilicon for forming the lower-stage dummy portion 14 for a relatively long time. Therefore, as shown in FIGS. 2C and 3A, when the gate oxide film 8 is thin at the time of etching the polysilicon 14a, the gate oxide film 8 on the upper surface of the semiconductor substrate may disappear by etching, and the n$^+$-type source layer 4 may be etched. On the other hand, in the present second preferred embodiment, as shown in FIG. 11B, since the gate oxide film 8 is thick at the time of polysilicon etching, etching on the upper surface of the semiconductor substrate and the n⁺-type source layer 4 can be suppressed.

First Modification

In the above description, only the two-stage gate A/D is disposed in the trench, but the present invention is not limited thereto.

Figure 12:
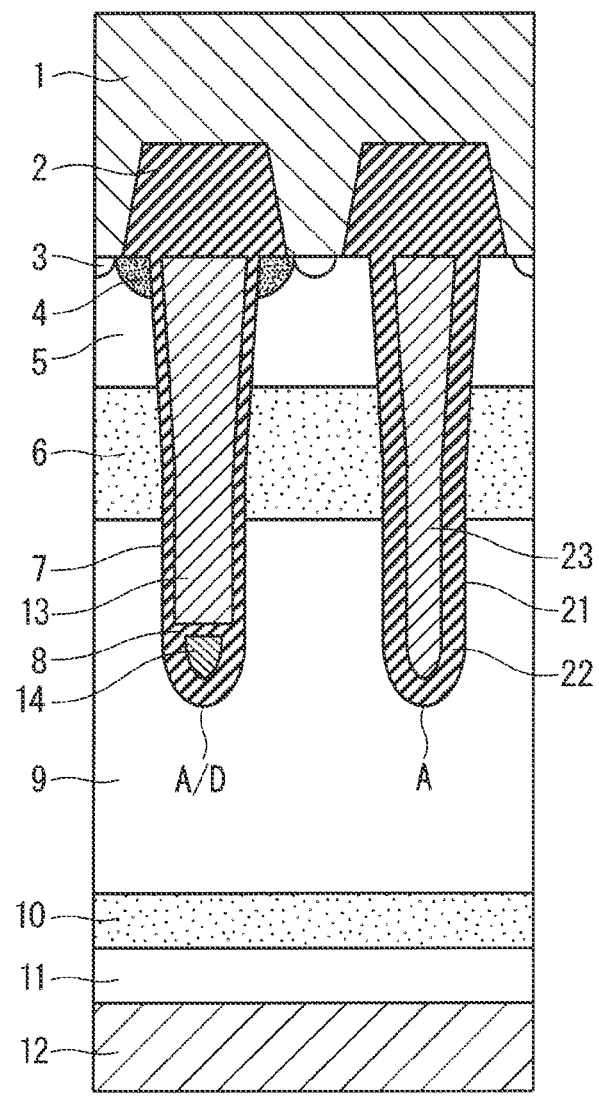
FIG. 12 is a cross-sectional view showing a configuration of a semiconductor device according to a first modification.

As a first example, as shown in FIG. 12, a one-stage gate A may be disposed in a trench 21 similar to the trench 7. That is, an active portion 23 being polysilicon disposed on the inner wall from the upper portion to the lower portion of the trench 21 via the fourth insulating film 22 similar to the gate oxide film 8 and connected to the gate electrode 15 may be disposed. In addition, in this configuration, the thickness of the fourth insulating film 22 between the active portion 23 of the one-stage gate A and the inner wall of the trench 21 may be larger than the thickness of the first insulating film between the upper-stage active portion 13 of the two-stage gate A/D and the inner wall of the trench 7.

Figure 13:
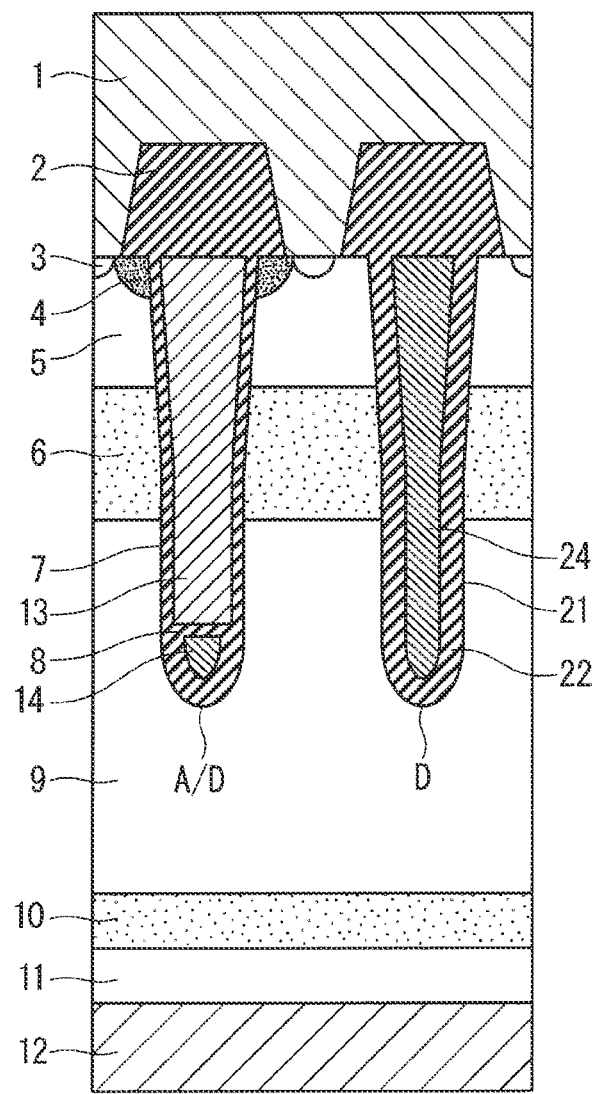
FIG. 13 is a cross-sectional view showing a configuration of a semiconductor device according to the first modification.

As a second example, as shown in FIG. 13, a one-stage dummy D may be disposed in the trench 21 similar to the trench 7. That is, a dummy portion 24 being polysilicon disposed on the inner wall from the upper portion to the lower portion of the trench 21 via the fourth insulating film 22 similar to the gate oxide film 8 and connected to the emitter electrode 1 may be disposed. In addition, in this configuration, the thickness of the fourth insulating film 22 between the dummy portion 24 of the one-stage dummy D and the inner wall of the trench 21 may be larger than the thickness of the first insulating film between the upper-stage active portion 13 of the two-stage gate A/D and the inner wall of the trench 7.

Next, a manufacturing method of the configuration of the present first modification will be described. It should be noted that here, a manufacturing method of a configuration including the two-stage gate A/D and the one-stage gate A will be described, but the same applies to a manufacturing method of a configuration including the two-stage gate A/D and the one-stage dummy D.

First, the steps in FIGS. 2A to 2C described in the first preferred embodiment are performed. Thus, polysilicon is formed on the inner wall of the trench 7 via the gate oxide film 8 and polysilicon is formed on the inner wall of the trench 21 via the fourth insulating film 22. Then, the polysilicon in the trench 7 of the two-stage gate A/D is exposed by the mask processing, and a mask is formed on the polysilicon in the trench 21 of the one-stage gate A.

Next, the upper portion of the polysilicon in the trench 7 of the two-stage gate A/D is etched without the polysilicon in the trench 21 of the one-stage gate A being etched, and the lower-stage dummy portion 14 of the two-stage gate A/D is formed. Then, the gate oxide film 8 formed on the inner wall of the upper portion of the trench 7, the lower-stage dummy portion 14, and the upper surface of the semiconductor substrate is removed by wet etching or the like.

Next, the semiconductor substrate is heated in an atmosphere containing oxygen, and the gate oxide film 8 is formed on the upper portion of the lower-stage dummy portion 14 of the two-stage gate A/D, the exposed inner wall of the trench 7, and the like. Thereafter, polysilicon doped with n-type or p-type impurities is deposited by CVD or the like in the trench 7 in which the gate oxide film 8 is formed, and the upper-stage active portion 13 is formed. It should be noted that a portion other than the upper-stage active portion 13 in the polysilicon is removed by etching. Thus, the two-stage gate A/D and the one-stage gate A are formed.

Gist of First Modification

Since the $C_{GC}/C_{GE}$ can be further increased in the configuration in which the one-stage gate A as described above is inserted, the turn-on loss can be further reduced. In addition, since injection of hot carriers generated by dynamic avalanche can be suppressed by the thick fourth insulating film 22 of the one-stage gate A, deterioration of gate characteristics can be suppressed.

On the other hand, in the configuration in which the one-stage dummy D having no gate capacitance as described above is inserted, the gate charge amount (Qg) of the semiconductor element can be reduced while $C_{GC}/C_{GE}$ is maintained.

Second Modification

Figure 14:
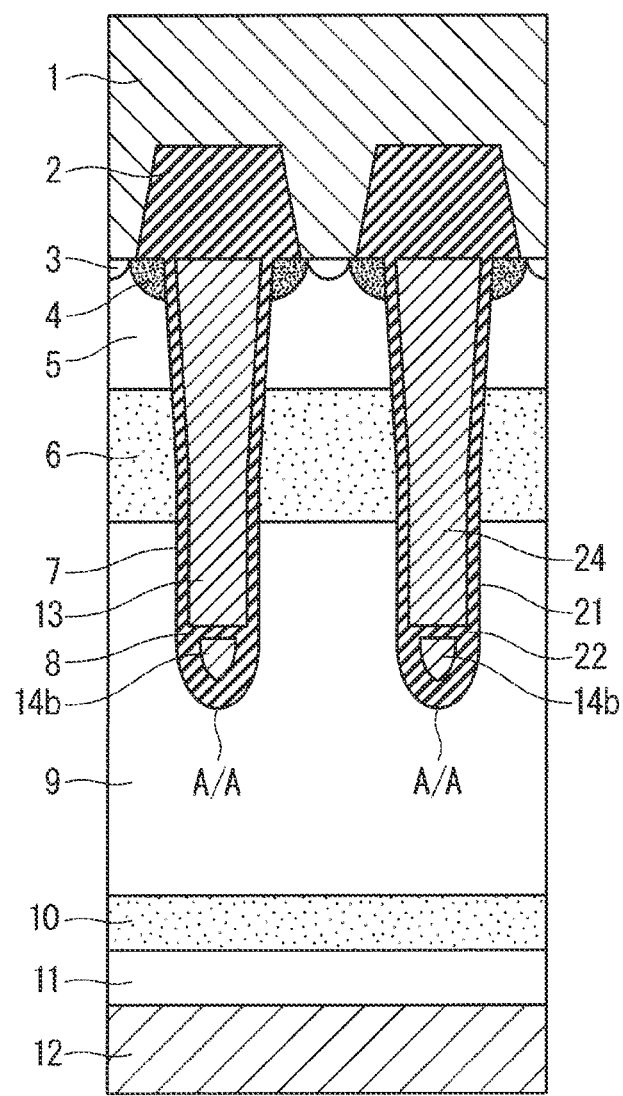
FIG. 14 is a cross-sectional view showing a configuration of a semiconductor device according to a second modification.

FIG. 14 is a cross-sectional view showing a configuration of a semiconductor device according to the present second modification.

The semiconductor device according to the first preferred embodiment includes the two-stage gate A/D, but present invention is not limited thereto. As shown in FIG. 14, the lower-stage polysilicon may be a lower-stage active portion 14b connected to the gate electrode 15 rather than the lower-stage dummy portion 14 connected to the emitter electrode 1. That is, the semiconductor device may include a two-stage gate A/A including the upper-stage active portion 13 and the lower-stage active portion 14b. In addition, in this configuration, the thickness of the second insulating film between the lower-stage active portion 14b and the inner wall of the trench 7 may be larger than the thickness of the first insulating film between the upper-stage active portion 13 and the inner wall of the trench 7.

In the two-stage gate A/A of the present second modification configured as described above, the portion where the active portion faces the n⁻-type drift layer 9 is larger than that in the two-stage gate A/D. Therefore, since the $C_{GC}/C_{GE}$ can be increased, the turn-on loss can be reduced. In addition, since injection of hot carriers generated by dynamic avalanche can be suppressed by the thick second insulating film, deterioration of gate characteristics can be suppressed.

Third Modification

Figure 15:
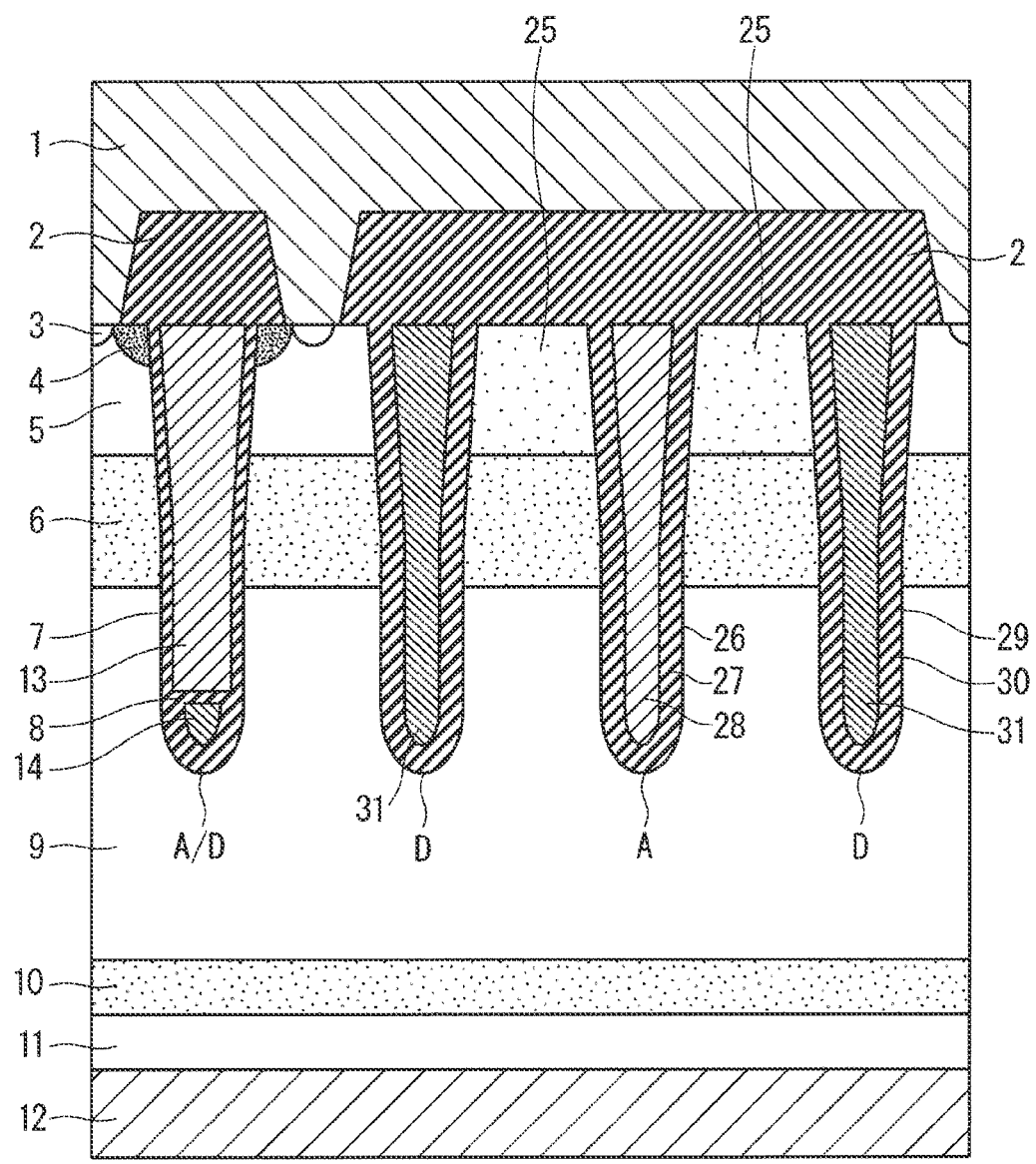
FIG. 15 is a cross-sectional view showing a configuration of a semiconductor device according to a third modification.

FIG. 15 is a cross-sectional view showing a configuration of a semiconductor device according to the present third modification.

The semiconductor device may include an electrically floated p-type semiconductor layer 25. It should be noted that similarly to the p-type base layer 5, the semiconductor layer 25 is disposed on the upper surface side of the n-type carrier stored layer 6. In addition, the semiconductor device may include the active portion 28 being polysilicon disposed on the inner wall from the upper portion to the lower portion of the trench 26 penetrating the semiconductor layer 25 and the n-type carrier stored layer 6 via the fourth insulating film 27 and connected to the gate electrode 15. That is, the active portion 28 may be disposed so as to be sandwiched between the floating semiconductor layers 25. It should be noted that the semiconductor device may include a dummy portion 31 being polysilicon disposed on the inner wall from an upper portion to a lower portion of the trench 29 provided adjacent to the trench 26 via the fifth insulating film 30 and connected to the emitter electrode 1.

According to the present third modification configured as described above, $C_{GC}$ occurs, rather than $C_{GE}$ occurring, between the floating semiconductor layer 25 and the active portion 28. Therefore, since the $C_{GC}/C_{GE}$ can be further increased, the turn-on loss can be further reduced.

Third Preferred Embodiment

Figure 16:
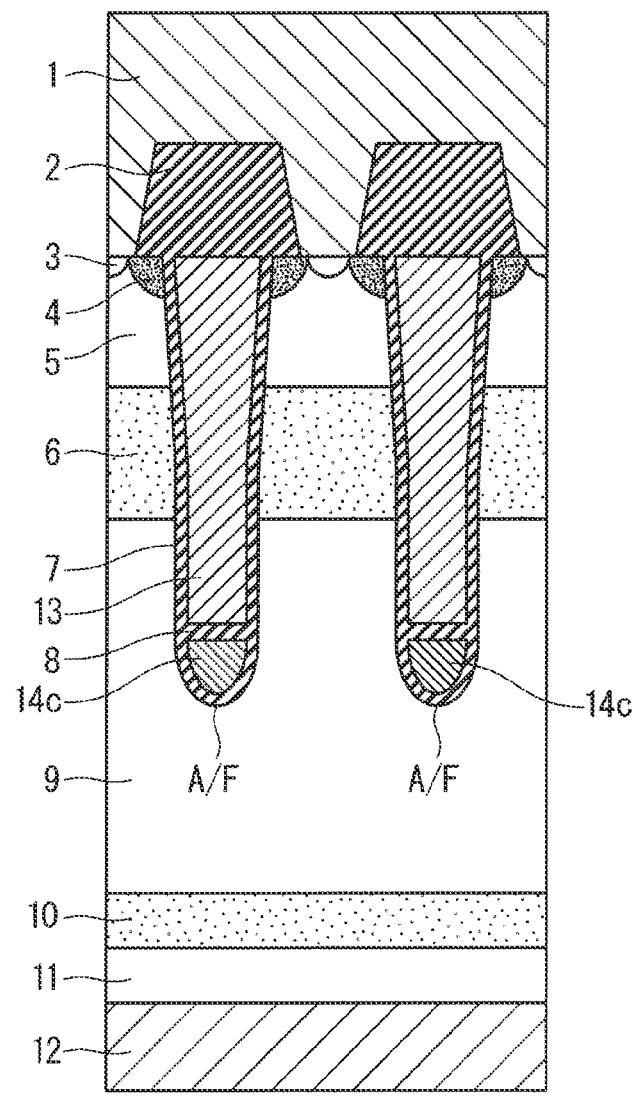
FIG. 16 is a cross-sectional view showing a configuration of a semiconductor device according to a third preferred embodiment.

FIG. 16 is a cross-sectional view showing a configuration of a semiconductor device according to the present third preferred embodiment.

The semiconductor device according to the first preferred embodiment includes the two-stage gate A/D, but present invention is not limited thereto. As shown in FIG. 16, the lower-stage polysilicon may be an electrically floated lower-stage floating portion 14c rather than the lower-stage dummy portion 14 connected to the emitter electrode 1. That is, the semiconductor device may include a two-stage gate A/F including the upper-stage active portion 13 and the lower-stage floating portion 14c that are electrically separated.

According to the present third preferred embodiment configured as described above, no $C_{GE}$ occurs between the upper-stage active portion 13 and the lower-stage floating portion 14c. Therefore, since the $C_{GE}$ can be reduced and the $C_{GC}/C_{GE}$ can be further increased, the turn-on loss can be further reduced.

Fourth Preferred Embodiment

Figure 17:
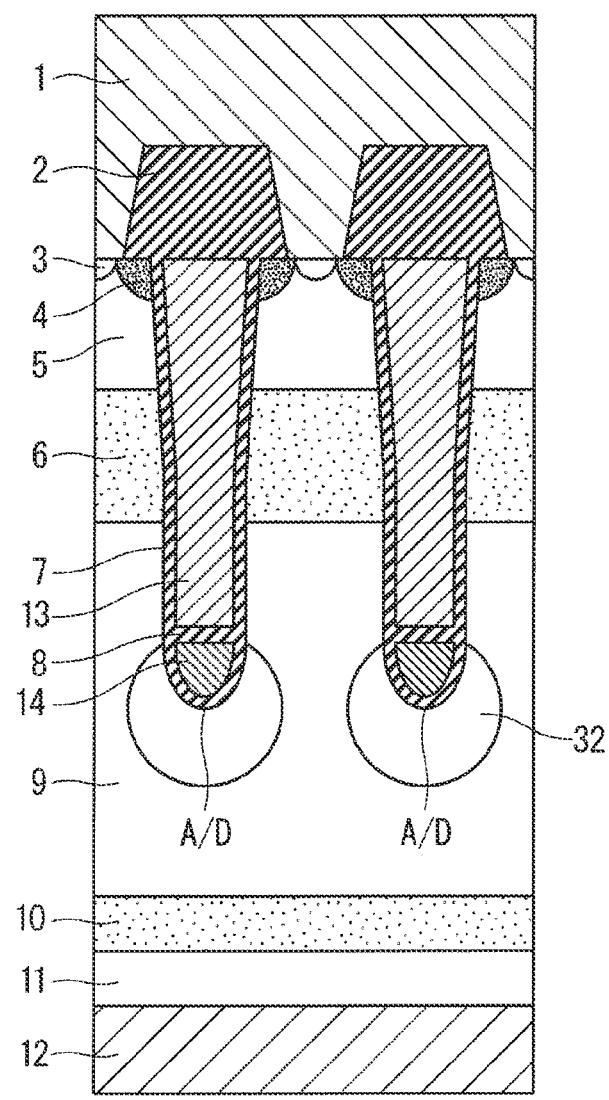
FIG. 17 is a cross-sectional view showing a configuration of a semiconductor device according to a fourth preferred embodiment.

FIG. 17 is a cross-sectional view showing a configuration of a semiconductor device according to the present fourth preferred embodiment.

The semiconductor device according to the present fourth preferred embodiment includes the p-type bottom layer 32 disposed at the bottom portion of the trench 7 in the semiconductor substrate. According to the present fourth preferred embodiment, the p-type bottom layer 32 can reduce the electric field at the bottom portion of the trench 7. Therefore, occurrence of dynamic avalanche can be suppressed, and deterioration of gate characteristics can be suppressed.

First Modification

Figure 18:
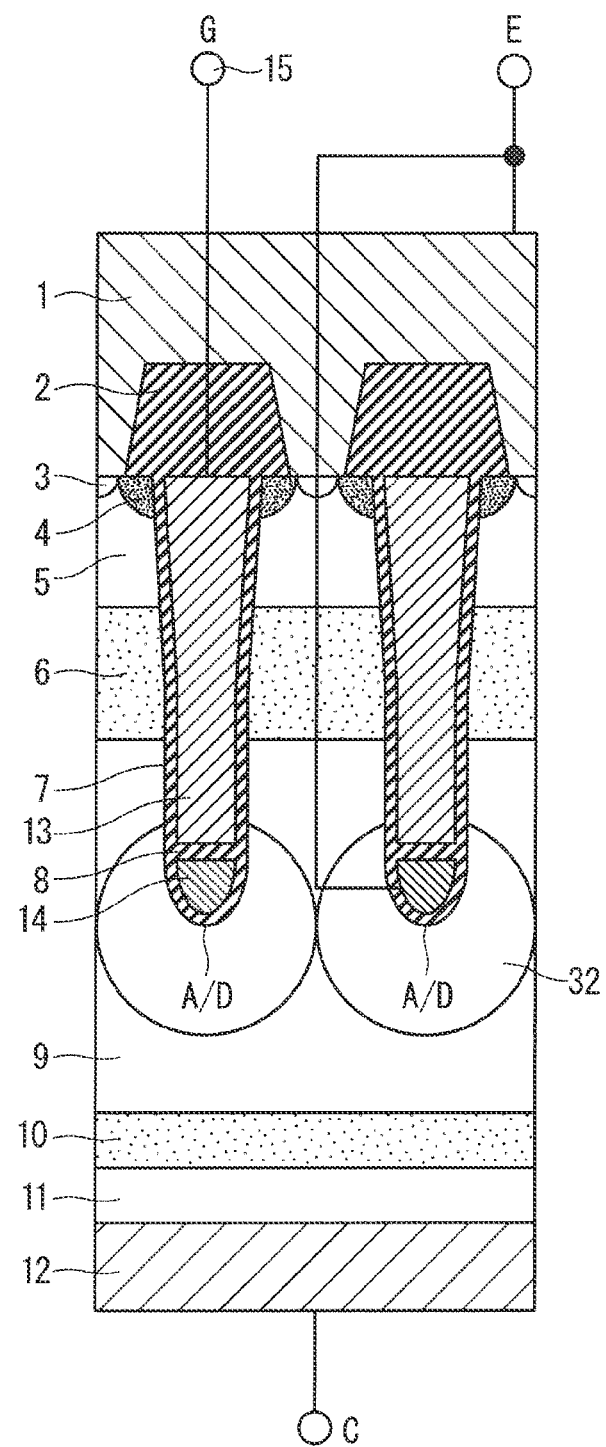
FIG. 18 is a cross-sectional view showing a configuration of a semiconductor device according to a first modification.

In the fourth preferred embodiment, the thickness and width of the p-type bottom layer 32 are relatively small, but the present invention is not limited thereto. As shown in FIG. 18, the thickness and width of p-type bottom layer 32 may be large to the extent that adjacent p-type bottom layers 32 can be connected to each other. According to this configuration, since the voltage can be maintained in a wider range by the p-type bottom layer 32, the electric field can be further reduced. Therefore, occurrence of dynamic avalanche can be further suppressed, and deterioration of gate characteristics can be suppressed.

It should be noted that in general, changing the potential of the p-type bottom layer 32 by holes at the time of turning-on causes a displacement current to occur. As shown in FIG. 18, when the floating p-type bottom layer 32 is disposed so as to face the upper-stage active portion 13, this displacement current flows into the upper-stage active portion 13 facing the p-type bottom layer 32 to fluctuate the gate potential and deteriorate the controllability of dV/dt.

Figure 19:
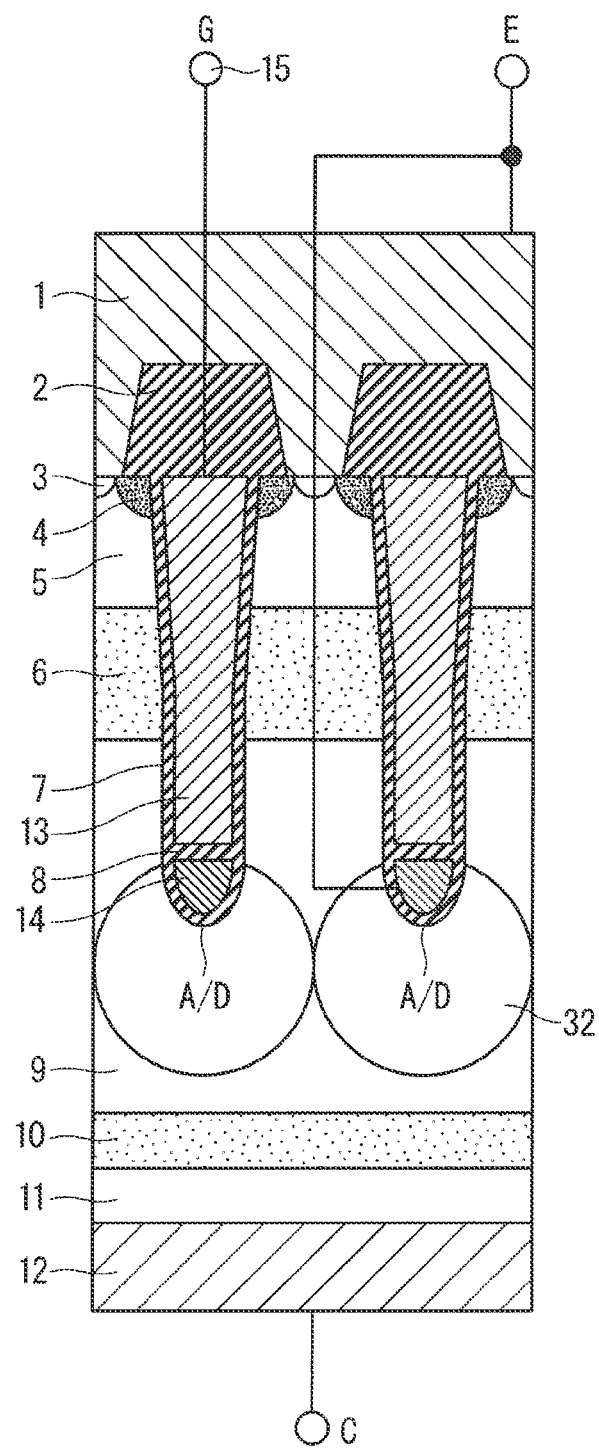
FIG. 19 is a cross-sectional view showing a configuration of a semiconductor device according to the first modification.

Thus, as shown in FIG. 19, the p-type bottom layer 32 may be configured to be in contact with the second insulating film between the lower-stage dummy portion 14 and the inner wall of the trench 7, without being in contact with the first insulating film between the upper-stage active portion 13 and the inner wall of the trench 7. That is, the p-type bottom layer 32 may be disposed so as not to face the upper-stage active portion 13. According to this configuration, fluctuation of the gate potential due to the displacement current can be suppressed.

First Modification of First to Fourth Preferred Embodiments

The upper-stage active portion 13 of first to fourth preferred embodiments may be used for a gate of an RC-IGBT. That is, the semiconductor element 100 of the first to fourth preferred embodiments may be an RC-IGBT. Hereinafter, the configuration of the RC-IGBT will be briefly described.

Figure 20:
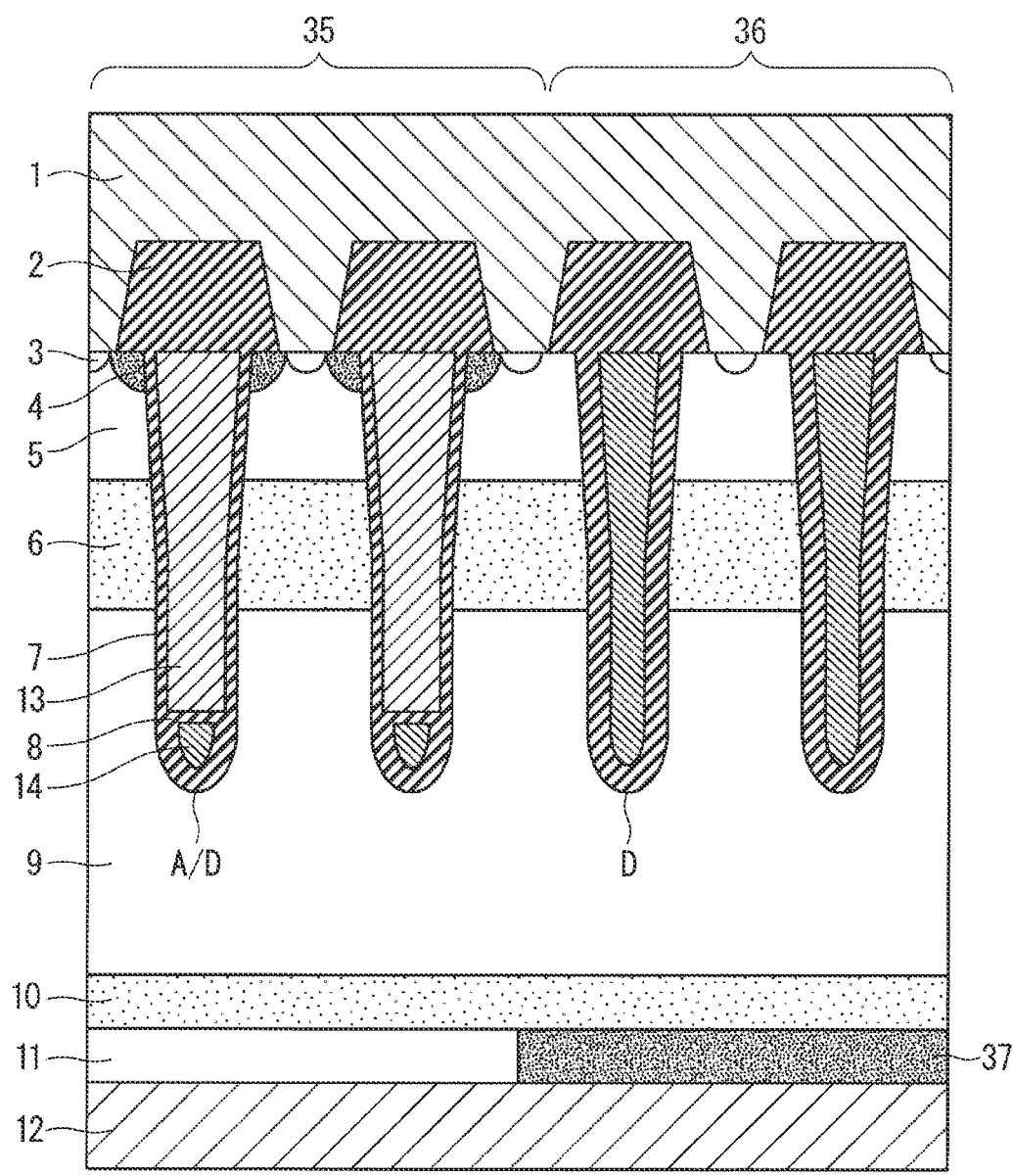
FIG. 20 is a cross-sectional view showing a configuration of a semiconductor device according to a first modification of the first to fourth preferred embodiments.

FIG. 20 is a cross-sectional view showing a configuration of the RC-IGBT. The RC-IGBT includes an IGBT region 35 in which an IGBT is disposed and a diode region 36 in which a diode is disposed. In the IGBT region 35, the same configuration as that of the first to fourth preferred embodiments is used. In the diode region 36, for example, the same configuration as that of the one-stage dummy D in FIG. 13 is used. However, in the diode region 36, the n-type cathode layer 37 is disposed rather than the p-type collector layer 11.

Second Modification of First to Fourth Preferred Embodiments

The upper-stage active portion 13 of the first to fourth preferred embodiments may be used for a gate of a metal oxide semiconductor field effect transistor (MOSFET). That is, the semiconductor element 100 of the first to fourth preferred embodiments may be a MOSFET.

Third Modification of First to Fourth Preferred Embodiments

In the first to fourth preferred embodiments, a semiconductor used for the semiconductor substrate or the like is not described, but the semiconductor may be silicon or a wide band gap semiconductor. The wide band gap semiconductor includes, for example, silicon carbide, a gallium nitride-based material, gallium oxide, or diamond. According to this configuration, the withstand voltage of the semiconductor device can be increased.

It should be noted that each of the preferred embodiments and each of the modifications can be freely combined, and each of the preferred embodiments and each of the modifications can be appropriately modified or omitted.

While the disclosure has been shown and described in detail, the foregoing description is in all aspects illustrative and not restrictive. It is therefore understood that numerous modifications and variations can be devised.

What is claimed is:
1. A semiconductor device comprising:
a semiconductor substrate provided with an emitter electrode and a gate electrode;
a carrier stored layer of a first conductivity type disposed on an upper surface side of the semiconductor substrate;
a base layer of a second conductivity type disposed on the upper surface side of the carrier stored layer;

a source layer of a first conductivity type disposed on the upper surface side of the base layer;

an upper-stage active portion disposed on a first insulating film along an inner wall of an upper portion of a trench penetrating the source layer, the base layer, and the carrier stored layer, the upper-stage active portion being upper-stage polysilicon connected to the gate electrode; and lower-stage polysilicon disposed on a second insulating film along an inner wall of a lower portion of the trench, the lower-stage polysilicon provided with a third insulating film disposed between the upper-stage active portion and the lower-stage polysilicon, wherein the lower-stage polysilicon is any one of a lower-stage dummy portion connected to the emitter electrode, a lower-stage active portion connected to the gate electrode, and a lower-stage floating portion electrically floated, and wherein a lower end of the upper-stage active portion is positioned below a lower end of the carrier stored layer.

2. The semiconductor device according to claim 1, wherein a depth of the upper-stage active portion is 1.5 times or more a depth of the base layer.

3. The semiconductor device according to claim 2, wherein a depth of the upper-stage active portion is twice or more a depth of the base layer.

4. The semiconductor device according to claim 1, wherein a thickness of the second insulating film is larger than a thickness of the first insulating film.

5. The semiconductor device according to claim 1, further comprising an active portion or a dummy portion disposed on a fourth insulating film along an inner wall from an upper portion to a lower portion of a trench penetrating the source layer, the base layer, and the carrier stored layer, the active portion being polysilicon connected to the gate electrode, the dummy portion being polysilicon connected to the emitter electrode, wherein a thickness of the fourth insulating film is larger than a thickness of the first insulating film.

6. The semiconductor device according to claim 1, further comprising:

a semiconductor layer of a second conductivity type disposed on the upper surface side of the carrier stored layer, the semiconductor layer electrically floated; and an active portion disposed on a fourth insulating film along an inner wall from an upper portion to a lower portion of a trench penetrating the semiconductor layer and the carrier stored layer, the active portion being polysilicon connected to the gate electrode.

7. The semiconductor device according to claim 1, further comprising a bottom layer of a second conductivity type disposed at a bottom portion of the trench in the semiconductor substrate.

8. The semiconductor device according to claim 7, wherein the bottom layer is in contact with the second insulating film without being in contact with the first insulating film.

9. The semiconductor device according to claim 1, wherein the upper-stage active portion is used for a gate of an RC-IGBT.

10. The semiconductor device according to claim 1, wherein the upper-stage active portion is used for a gate of a MOSFET.

11. The semiconductor device according to claim 1, wherein the semiconductor substrate includes a wide band gap semiconductor.

* * * * *